United States Patent
Muench et al.

(10) Patent No.: US 10,601,216 B2
(45) Date of Patent: Mar. 24, 2020

(54) DISTRIBUTED ENVIRONMENT ANALOG MULTIPLEXOR WITH HIGH-VOLTAGE PROTECTION

(71) Applicant: International Business Machines Corporation, Armonk, NY (US)

(72) Inventors: Paul D. Muench, Poughkeepsie, NY (US); Miguel E. Perez, Poughkeepsie, NY (US); George E. Smith, III, Wappingers Falls, NY (US); Michael A. Sperling, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 478 days.

(21) Appl. No.: 15/380,004

(22) Filed: Dec. 15, 2016

(65) Prior Publication Data

US 2018/0175608 A1    Jun. 21, 2018

(51) Int. Cl.
*H02H 3/20*    (2006.01)
*H03K 17/0812*    (2006.01)
*H03K 17/693*    (2006.01)

(52) U.S. Cl.
CPC ......... *H02H 3/20* (2013.01); *H03K 17/08122* (2013.01); *H03K 17/693* (2013.01); *H03K 2217/0054* (2013.01)

(58) Field of Classification Search
CPC .. H02H 3/20; H03K 17/693; H03K 17/08122; H03K 2217/0054

(Continued)

(56) References Cited

U.S. PATENT DOCUMENTS

| 4,595,847 A | 6/1986 | Weir |
| 5,636,745 A * | 6/1997 | Crisp ................. H05K 13/0084 |
| | | 206/725 |

(Continued)

FOREIGN PATENT DOCUMENTS

EP    2293444 A2    3/2011

OTHER PUBLICATIONS

EP-2293444; High voltage switch in low voltage process; Lee Edward; Publication Date: Sep. 3, 2011; Abstract, Fgures, speification. (Year: 2011).*

*Primary Examiner* — Dharti H Patel
(74) *Attorney, Agent, or Firm* — Cantor Colburn LLP; Margaret McNamara

(57) ABSTRACT

An analog multiplexer includes a plurality of voltage-protecting transmission gate circuits to select an input voltage signal among different input signals. Each voltage-protecting transmission gate circuit includes a pass gate pFET interconnected between an input pFET and an output pFET, as well as a parallel pass gate nFET. The pFET includes a first source/drain connected in series with the input pFET. A second source/drain is connected in series with the output pFET. A pFET gate receives a gate select signal that operates the transmission gate circuit in a blocking mode, a first passing mode, or a second passing mode. The nFET includes a first nFET source/drain connected to the input pFET to form a main input terminal that receives the input voltage signal. A second nFET source/drain is connected to the output pFET to form a main output terminal that outputs an output voltage based on the operating mode.

20 Claims, 5 Drawing Sheets

(58) Field of Classification Search
USPC .......................................................... 361/86
See application file for complete search history.

(56) References Cited

U.S. PATENT DOCUMENTS

| | | | |
|---|---|---|---|
| 6,163,199 | A | 12/2000 | Miske et al. |
| 6,700,431 | B1 | 3/2004 | Fotouhi et al. |
| 7,859,305 | B2 * | 12/2010 | Uno ................. H03K 19/00315 |
| | | | 326/27 |
| 9,171,832 | B2 | 10/2015 | Salcedo et al. |
| 2007/0008000 | A1 * | 1/2007 | Lee ...................... H03K 17/063 |
| | | | 326/41 |
| 2015/0381160 | A1 * | 12/2015 | Draxelmayr ......... H03K 17/161 |
| | | | 327/382 |

* cited by examiner

DISTRIBUTED ENVIRONMENT ANALOG MULTIPLEXOR WITH HIGH-VOLTAGE PROTECTION

BACKGROUND

The present invention relates to analog multiplexers, and more specifically, to pass gates included in an analog multiplexer.

Today's large computer chips still require many analog circuits to function correctly. Often it is necessary to multiplex between many of these analog signals from all across the chip, whether for characterization, debug or functionality. In previous technologies, a simple transmission gate multiplexer composed of transistors with thick gate oxides was used along with high voltage select lines to block the disabled paths. In today's technologies access to thick gate oxides can be limited or is not available. Since the device breakdown voltage of these conventional pass gates is often only around one volt, the maximum analog voltage of any of the multiplexor inputs must be known in order to implement these conventional pass gates.

SUMMARY

According to an embodiment of the present invention, an analog multiplexer comprises a plurality of voltage-protecting transmission gate circuits formed on an integrated chip (IC). The voltage-protecting transmission gate circuits are configured to select an input voltage signal among a plurality of different input signals and to generate an output voltage signal based on the selected input signal. Each voltage-protecting transmission gate circuit comprises a pass gate p-type field effect transistor (pFET) interconnected between an input pFET and an output pFET, as well as a parallel n-type field effect transistor (nFET) pass gate. The pass gate pFET includes a first pFET source/drain connected in series with a first input source/drain of the input pFET to define a first mid-point node, a second pFET source/drain connected in series with a first output source/drain of the output pFET to define a second mid-point node, and a first pFET gate terminal configured to receive a pass gate select signal that selectively operates the voltage-protecting transmission gate circuit in a voltage blocking mode, a first voltage passing mode, or a second voltage passing mode. The pass gate nFET includes a first nFET source/drain connected to a second input source/drain of the input pFET to form a main input terminal configured to receive the input voltage signal, a second nFET source/drain connected to a second output source/drain of the output pFET to form a main output terminal that outputs an output voltage, and an nFET gate configured to receive a pass gate nFET select signal. Each voltage-protecting transmission gate circuit blocks an input voltage from reaching the main output terminal or passes an input voltage to the main output terminal based on the selected operating mode.

According to another non-limiting embodiment, a voltage-protecting transmission gate circuit comprises a p-type field effect transistor (pFET) pass gate interconnected between an input pFET and an output pFET, as well as a parallel n-type field effect transistor (nFET) pass gate. The pass gate includes a first pFET source/drain connected in series with a first input source/drain of the input pFET to define a first mid-point node, a second pFET source/drain connected in series with a first output source/drain of the output pFET to define a second mid-point node, and a first pFET gate terminal configured to receive a pass gate select signal that selectively operates the voltage-protecting transmission gate circuit in a voltage blocking mode, a first voltage passing mode, or a second voltage passing mode. The pass gate nFET includes a first nFET source/drain connected to a second input source/drain of the input pFET to form a main input terminal configured to receive the input voltage signal, a second nFET source/drain connected to a second output source/drain of the output pFET to form a main output terminal that outputs an output voltage, and an nFET gate configured to receive a pass gate nFET select signal. Based on the selected operating mode of the voltage-protecting transmission gate circuit, an input voltage applied to the main input terminal is either blocked from reaching the main output terminal or is passed to the main output terminal.

According to yet another non-limiting embodiment, a method is provided that selectively delivers an input voltage from a main input terminal of a voltage-protecting transmission gate circuit to a main output terminal of the voltage-protecting transmission gate circuit. The method comprises applying a pass gate select signal to a first pFET gate terminal of a pass gate pFET that selectively operates the voltage-protecting transmission gate circuit in a voltage blocking mode, a first voltage passing mode, or a second voltage passing mode. The pass gate pFET includes a first pFET source/drain connected in series with a first input source/drain of the input pFET to define a first mid-point node, and a second pFET source/drain connected in series with a first output source/drain of the output pFET to define a second mid-point node. The method further includes applying a pass gate nFET select signal to an nFET gate included with the voltage-protecting transmission gate circuit. The nFET gate includes a first nFET source/drain connected to a second input source/drain of the input pFET to form the main input terminal, and a second nFET source/drain connected to a second output source/drain of the output pFET to form the main output terminal that outputs an output voltage. The voltage blocking mode blocks an input voltage applied to the main input terminal from reaching the main output terminal, and the first and second voltage passing modes pass an input voltage from the main input terminal to the main output terminal.

DETAILED DESCRIPTION

Various non-limiting embodiments provide a voltage-protecting transmission gate circuit that can be implemented in an analog multiplexer. The voltage-protecting transmission gate circuit implements series p-type transistors on both the input and output of a center p-type transistor pass gate as well as a parallel n-type transistor pass gate. This topology allows for blocking the input voltage signal using low voltage on the interface while maintaining a high voltage blocking signal on the center p-type transistor pass gate. Unlike conventional transmission gates, the voltage-protecting transmission gate circuit can protect every transistor from realizing the technology voltage maximum between any two if their terminals without requiring thick oxide layers.

Figure 1:
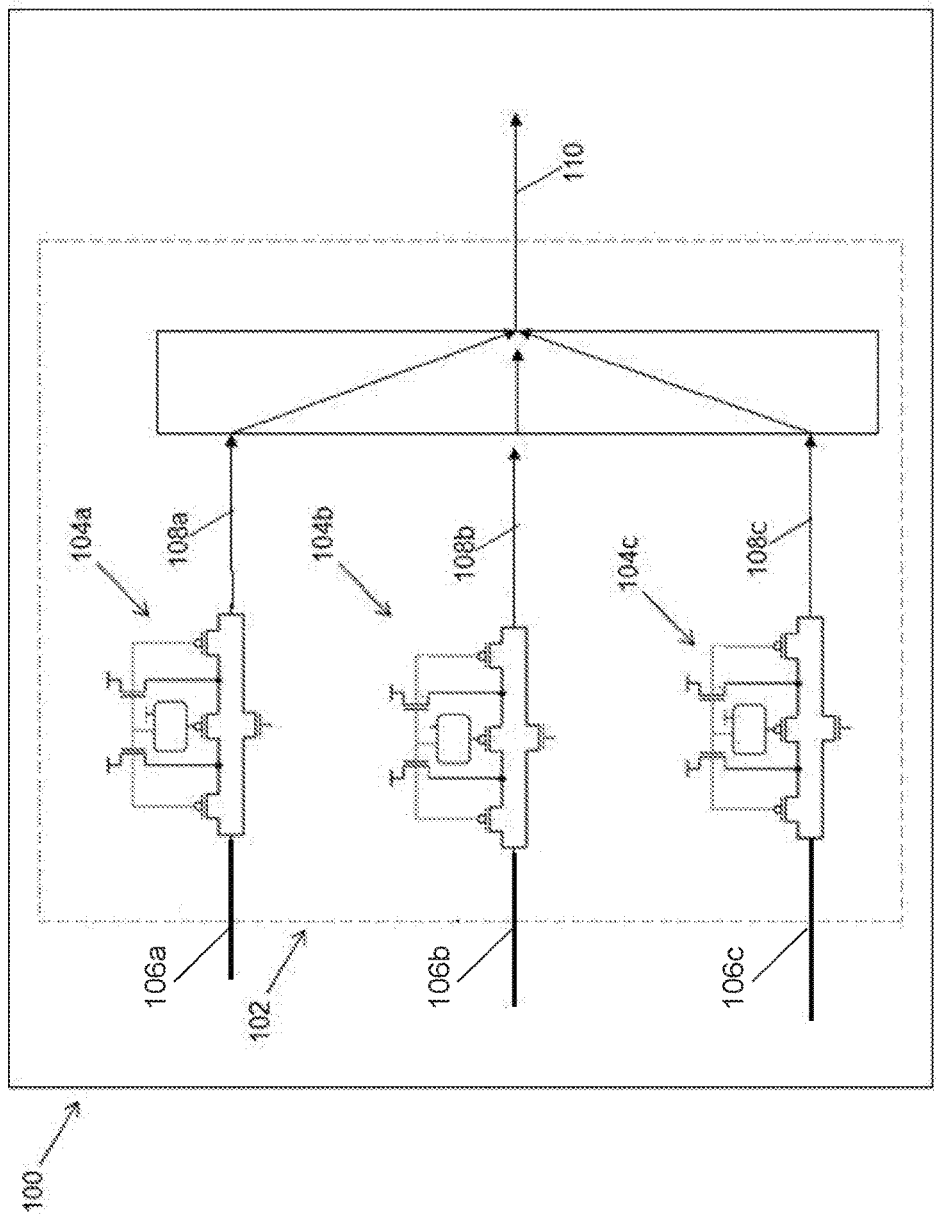
FIG. 1 illustrates an analog multiplexer including of a plurality of voltage-protecting transmission gate circuits according to at least one non-limiting embodiment.

Turning now to FIG. 1, an integrated chip (IC) 100 including an analog multiplexer 102 (MUX 102) is illustrated according to at least one non-limiting embodiment. The analog multiplexer 102 includes a plurality voltage-protecting transmission gate circuits 104a-104c formed on the IC 100. The voltage-protecting transmission gate circuits 104a-104c operate in conjunction with one another to select an input voltage signal among a plurality of different input signals and to generate an output voltage signal based on the selected input signal.

For instance, each voltage-protecting transmission gate circuit 104a-104c receives an individual input voltage signal at its respective input 106a-106c. A particular transmission gate circuit 104 can be operated in a voltage blocking mode or a voltage passing mode. A transmission gate circuit 104a-104c operating in the voltage blocking mode blocks its input voltage from reaching its respective output 108a-108c. When, however, operating in the voltage passing mode, a given transmission gate circuit 104 passes (i.e., delivers) its input voltage from its input 106a-106c to its output 108a-108c. In this manner, a particular transmission gate circuit 104 connected to a desired input voltage or input signal can be operated in the voltage passing mode, while the remaining transmission gate circuits 104 are operating in the voltage blocking mode such that the desired input voltage or input signal is obtained at the MUX output 110 of the analog multiplexer 102.

Figure 2:
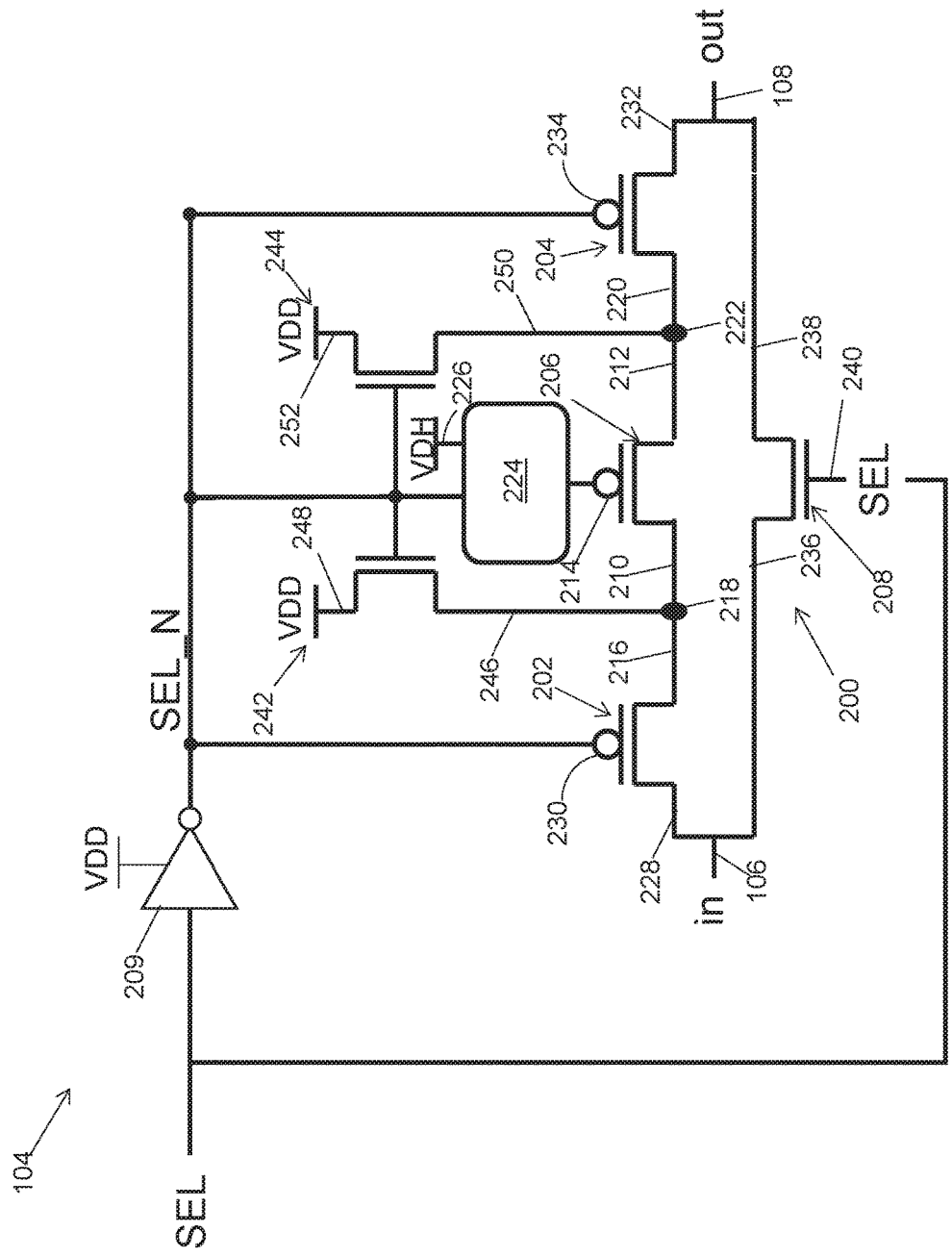
FIG. 2 illustrates one of a plurality of voltage-protecting transmission gate circuits included in the analog multiplexer of FIG. 1 according to a non-limiting embodiment.

Referring to FIG. 2, an individual voltage-protecting transmission gate circuit 104 is illustrated according to a non-limiting embodiment. Unlike conventional pass gates that utilize thick gate oxides, the transmission gate circuit 104 according to at least one embodiment is capable of providing voltage protection with an oxide layer having thinner oxide gate thickness. Unlike conventional transmission gates, voltage-protecting transmission gate circuit 104 according to at least one non-limiting embodiment is composed of transistors with a gate oxide layer thickness of about 0.8 nanometer (nm) to about 1.0 nm which is much less than traditional thick oxide-based transmission gates (e.g., 2.0 nm). The transmission gate 200 includes a pass gate p-type field effect transistor (pFET) 206 and a pass gate n-type field effect transistor (nFET) 208. The pass gate pFET 206 is interconnected between an input pFET 202 and an output pFET 204. The pass gate nFET 208 is connected in parallel with the input pFET 202, the pass gate pFET 206 and the output pFET 204. A NOT-gate 209 (i.e., inverter 209) is provided to generate a pFET gate select signal as described in greater detail below.

The pass gate pFET 206 includes a first pFET source/drain connected 210, a second pFET source/drain 212, and a first pFET gate terminal 214. The first pFET source/drain 210 is connected in series with a first input source/drain 216 of the input pFET 202 to define a first mid-point node 218. The second pFET source/drain 212 is connected in series with a first output source/drain 220 of the output pFET 204 to define a second mid-point node 222. The first pFET gate terminal 214 is connected to a level shifter 224. The level shifter 224 includes a power terminal 226 configured to receive a high-voltage power supply signal (VDH). The level shifter 224 also includes an input terminal connected to gate select signal (SEL_N) having a first voltage level (VDD). The level shifter 224 can convert the SEL_N signal from operating at a first voltage level into a different second voltage level (VDH), which is then delivered to the first pFET gate terminal 214. For example, when the level shifter 224 receives an input signal of 0 V, the level shifter outputs 0 V to the first pFET gate terminal 214. When however, the level shifter 224 receives an input signal of 0.8 V, the level shifter outputs 1.5 V to the first pFET gate terminal 214. In this manner, the level shifter 224 can selectively control the voltage of the gate select signal applied to the first pFET gate terminal 214 with respect to the output voltage generated by the NOT-gate 209.

Still referring to FIG. 2, the input pFET 202 further includes a second input source/drain 228 and an input gate terminal 230. The output pFET 204 further includes a second output source/drain 232 configured to output an output voltage signal, and an output gate terminal 234 configured to receive the first supply voltage select signal (e.g., SEL_N).

The second source/drain 228 is configured to receive an input voltage signal. This input voltage signal can ultimately be delivered to the second pFET source/drain 212 based on the operating mode (i.e., blocking mode or passing mode) of the voltage-protecting transmission gate circuit 104 as described above. The input gate terminal 230 is configured to receive a first supply voltage select signal (SEL_N), which activates or deactivates the input pFET 202. In at least one embodiment, the first supply voltage select signal has a voltage level less than the voltage level of the high-voltage select signal.

The pass gate nFET 208 includes a first nFET source/drain 236 connected to the second input source/drain 228 to form a main input terminal 106, a second nFET source/drain 238 connected to the second output source/drain 232 to form a main output terminal 108, and an nFET gate 240. The main input terminal 106 is configured to receive the input voltage signal. The nFET gate 240 is configured to receive a pass gate nFET select signal (e.g., SEL). The main output terminal 108 is configured to generate an output voltage signal based on the operating mode of the voltage-protecting transmission gate circuit 104 as described in greater detail below.

Still referring to FIG. 2, the transmission gate circuit 104 includes a first nFET 242 and a second nFET 244. The first nFET 242 includes a first nFET source/drain 246 connected to the first mid-point node 218 and a second nFET source/drain 248 configured to receive a supply voltage (e.g., VDD). The second nFET 244 includes a third nFET source/drain 250 connected to the second mid-point node 222 and a fourth source/drain 252 configured to receive a second supply voltage (e.g., VDD). The first and second nFETs 242 and 242 are normally closed switches (i.e., closed biased) while the pFETs 202, 204 and 206 are normally open switches (i.e., open biased). Therefore, the NOT-gate 209 is provided to generate the proper gate select signal (SEL_N) to switch on the pFETs 202, 204 and 206 and turn off the nFETs 242 and 244.

Figure 3:
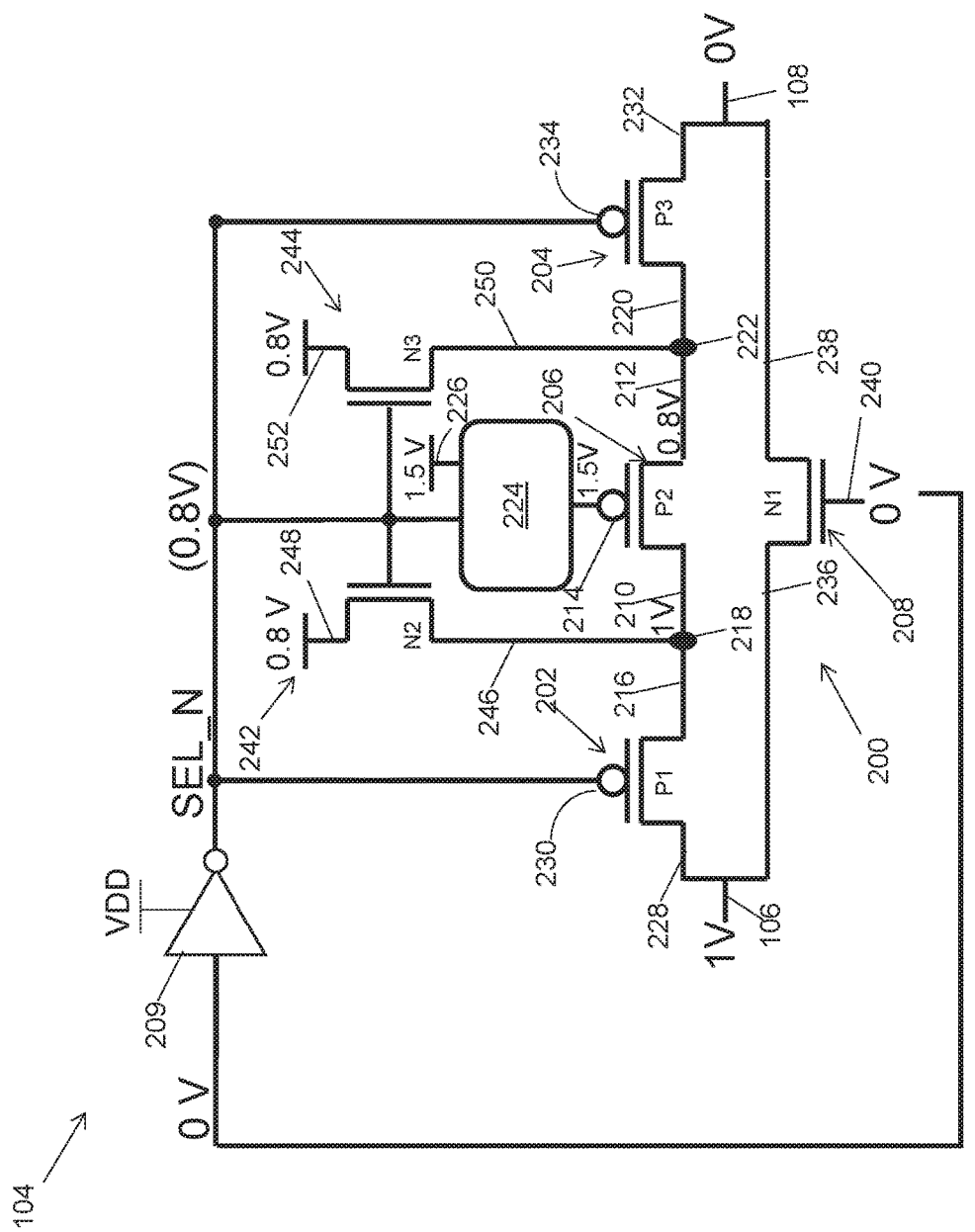
FIG. 3 illustrates the voltage-protecting transmission gate circuit of FIG. 2 operating in a voltage blocking mode.
Figure 4:
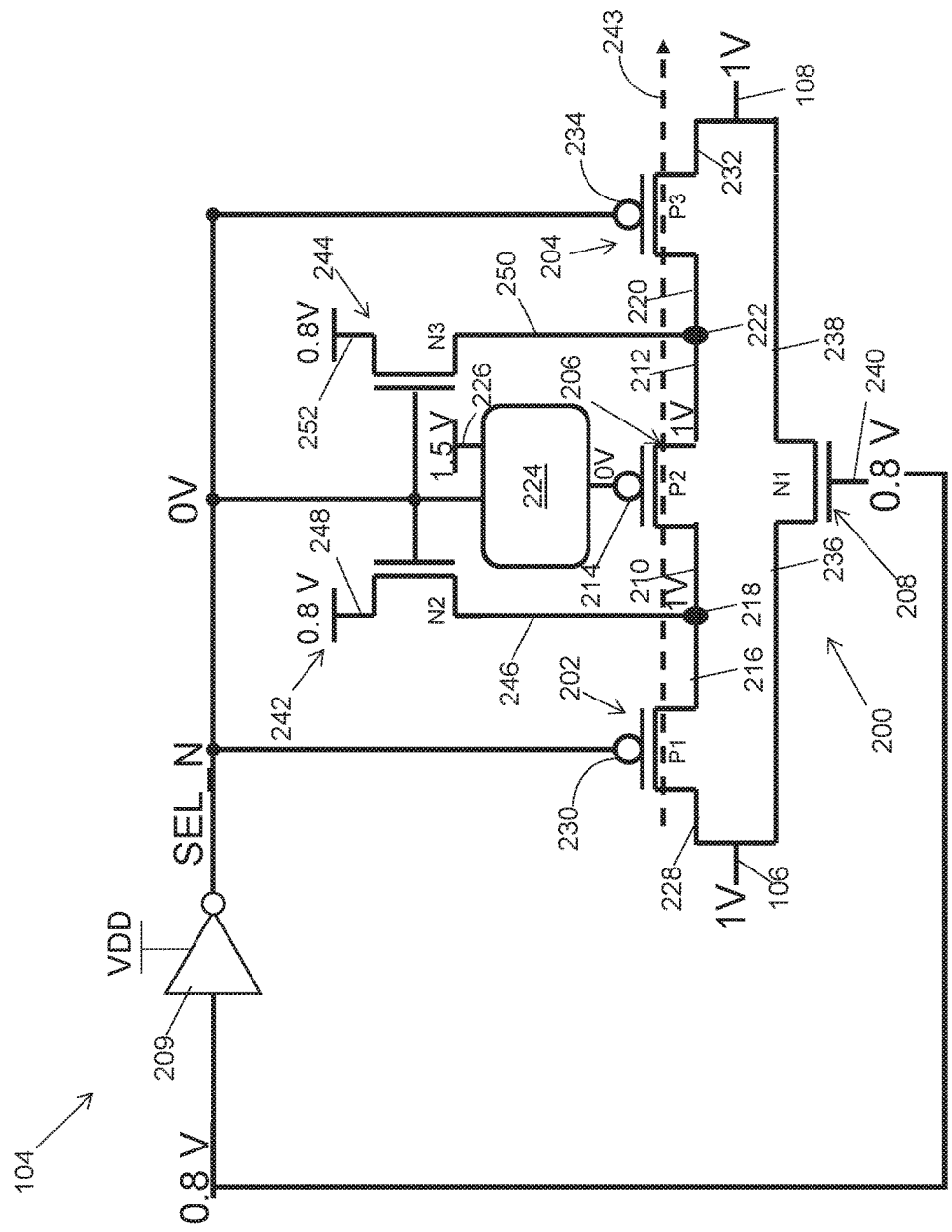
FIG. 4 illustrates the voltage-protecting transmission gate circuit of FIG. 2 operating in a first voltage passing mode.
Figure 5:
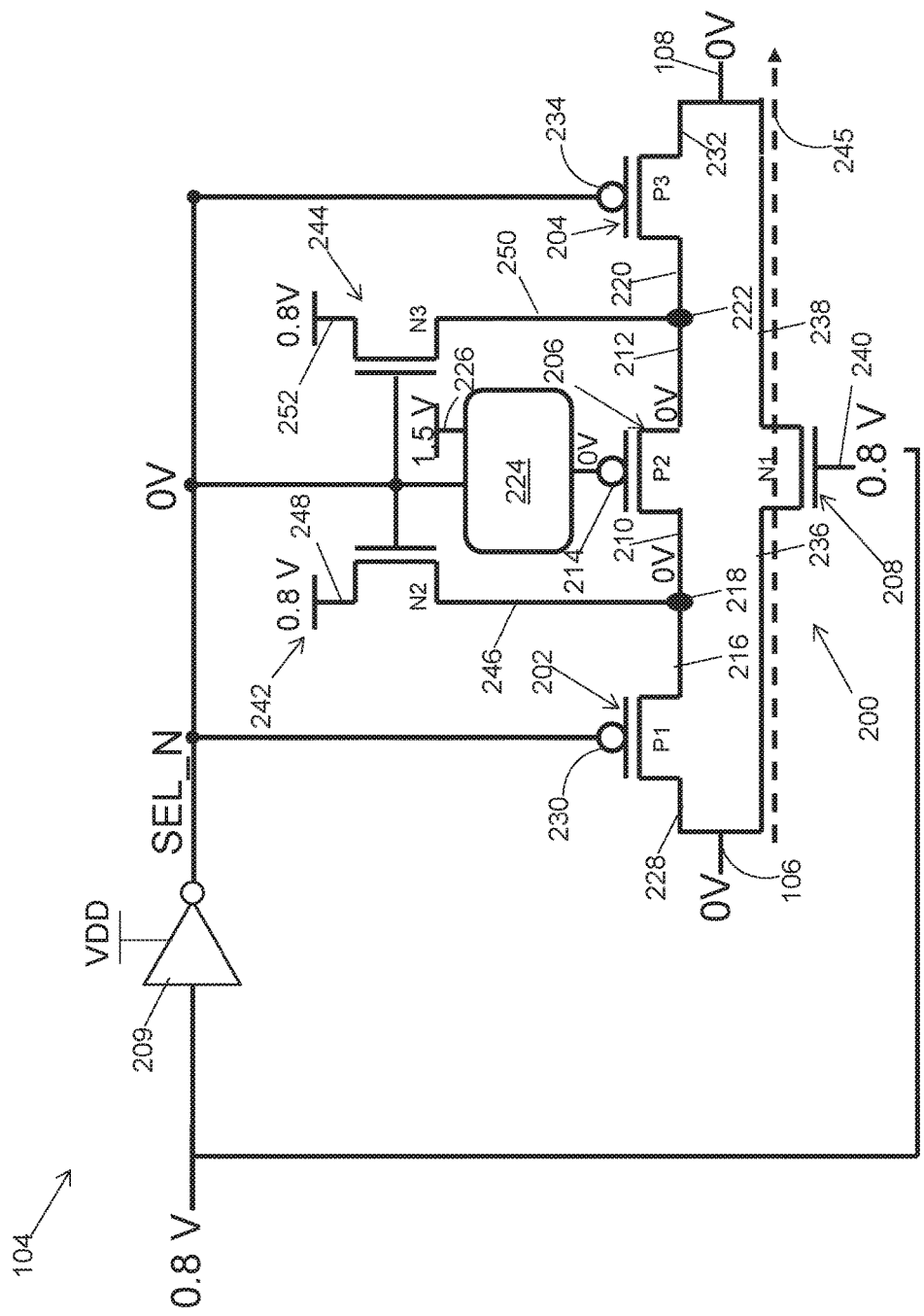
FIG. 5 illustrates the voltage-protecting transmission gate circuit of FIG. 2 operating in a second voltage passing mode.

Turning now to FIGS. 3-5, the transmission gate circuit 104 is illustrated operating in different modes (e.g., a voltage blocking mode, first voltage passing mode, or second voltage passing mode) according to various non-limiting embodiments. For instance, the FIG. 3 illustrates the transmission gate circuit 104 operating in the voltage blocking mode. More specifically, the transmission gate circuit 104 operates in the voltage blocking mode when a voltage level (e.g., 1.5 V) applied to the first pFET gate terminal 214 is greater than a voltage level (e.g., 0.8 V) of the first supply voltage select signal applied to the input gate terminal 230. When operating in the voltage blocking mode, the input pFET 202 turns on marginally, while the pass gate pFET 206 and the output pFET 204 are switched off such that no forward electrically conductive path is created. In addition, the first nFET 208 is also switched off. Accordingly, the first input voltage (e.g., 1 v) applied to the main input terminal 106 is disconnected from the second output source/drain 232 such that a high impedance (i.e., high-Z) is realized at the main output terminal 108. Also, all transistors realize a voltage level that is no greater than the input voltage applied to the main input terminal 106 between any two terminals. For instance, in response to invoking the blocking mode, the first mid-point node 218 has a voltage level approximately equal to the first input voltage (e.g., 1 V), and the second mid-point node 222 has a voltage approximately equal to the second supply voltage 0.8 V.

Referring to FIG. 4, the transmission gate circuit 104 is illustrated operating in a first voltage passing mode. More specifically, the transmission gate circuit 104 operates in the first voltage passing mode when the voltage level applied to the first pFET gate terminal 214 is approximately 0 volts and the input voltage (e.g., 1 V) applied to the main input terminal 106 is greater than a voltage level (e.g., 0.8 V) of the pass gate nFET select signal applied to the nFET gate 240. Accordingly, the first input voltage (e.g., 1 V) applied to the main input terminal 106 is delivered to the second output source/drain 232. In addition, the first and second mid-point nodes 218 and 222 have a voltage level approximately equal to the first input voltage (e.g., 1 V) applied to the main input terminal 106. Thus, the transmission gate circuit 104 operates to pass the input voltage (e.g. 1 V) from the main input terminal 106 to the main output terminal 108 as indicated by the directional arrow 243 shown in FIG. 4.

Referring to FIG. 5, the transmission gate circuit 104 is illustrated operating in a second voltage passing mode. More specifically, the transmission gate circuit 104 operates in the second voltage passing mode when the voltage level (e.g., 0 V) applied to the first pFET gate terminal 214 is approximately 0 volts and the input voltage (e.g., 0 V) applied to the main input terminal 106 is less than a voltage level of the pass gate nFET select signal (e.g., 0.8 V). When operating in the second voltage passing mode, the first nFET 208 is switched on, while first nFET 242 and the second nFET 244 are switched off such that the signal is not affected. In addition, the first and second mid-point nodes 218 and 222 have a voltage level approximately equal to the second input voltage (e.g., 0 V). Accordingly, a different second input voltage (e.g., 0 V) applied to the main input terminal 106 is delivered (i.e., passed) to the main output terminal 108 as indicated by the directional arrow 245 shown in FIG. 5.

The flowchart and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, the term "module" refers to an application specific integrated circuit (ASIC), an electronic circuit, an electronic computer processor (shared, dedicated, or group) and memory that executes one or more software or firmware programs, a combinational logic circuit, and/or other suitable components that provide the described functionality. When implemented in software, a module can be embodied in memory as a non-transitory machine-readable storage medium readable by a processing circuit and storing instructions for execution by the processing circuit for performing a method.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An analog multiplexer, comprising:
a plurality of voltage-protecting transmission gate circuits formed on an integrated chip (IC), the plurality of voltage-protecting transmission gate circuits configured to select an input voltage signal among a plurality of different input signals and to generate an output voltage signal based on the selected input signal, each voltage-protecting transmission gate circuit comprising:
a pass gate p-type field effect transistor (pFET) interconnected between an input pFET and an output pFET; and
a pass gate n-type field effect transistor (nFET) connected in parallel with the pass gate pFET, the input pFET and the output pFET,
wherein the pass gate pFET includes a first pFET source/drain connected in series with a first input source/drain of the input pFET to define a first mid-point node, a second pFET source/drain connected in series with a first output source/drain of the output pFET to define a second mid-point node, and a first pFET gate terminal configured to receive a pass gate select signal that selectively operates the voltage-protecting transmission gate circuit in a voltage blocking mode, a first voltage passing mode, or a second voltage passing mode, and
wherein the pass gate nFET includes a first nFET source/drain connected to a second input source/drain of the input pFET to form a main input terminal configured to receive the input voltage signal, a second nFET source/drain connected to a second output source/drain of the output pFET to form a main output terminal that outputs an output voltage, and a nFET gate configured to receive a pass gate nFET select signal.

2. The analog multiplexer of claim 1, wherein the input pFET further includes an input gate configured to receive a first supply voltage select signal, the first supply voltage select signal having a voltage level less than a high-voltage select signal.

3. The analog multiplexer of claim 2, wherein the output pFET further includes an output gate configured to receive the first supply voltage select signal.

4. The analog multiplexer of claim 3, further comprising a level shifter including an input terminal configured to receive a high-voltage select signal having a first voltage level and to convert the first voltage level into the pass gate select signal.

5. The analog multiplexer of claim 4, further comprising a first nFET including a first nFET source/drain connected to the first mid-point node and a second nFET source/drain configured to receive a supply voltage, and a second nFET including a third nFET source/drain connected to the second mid-point node and a fourth source/drain configured to receive a second supply voltage.

6. The analog multiplexer of claim 5, wherein at least one of the pass gate pFET, the input pFET, and the output pFET includes a gate oxide having a thickness ranging from 0.8 nanometers (nm) to 1.0 nm.

7. A voltage-protecting transmission gate circuit, comprising:
a pass gate p-type field effect transistor (pFET) interconnected between an input pFET and an output pFET; and
a pass gate n-type field effect transistor (nFET) connected in parallel with the pass gate pFET, the input pFET and the output pFET,
wherein the pass gate pFET includes a first pFET source/drain connected in series with a first input source/drain of the input pFET to define a first mid-point node, a second pFET source/drain connected in series with a first output source/drain of the output pFET to define a second mid-point node, and a first pFET gate terminal configured to receive a pass gate select signal that selectively operates the voltage-protecting transmission gate circuit in a voltage blocking mode, a first voltage passing mode, or a second voltage passing mode, and
wherein the pass gate nFET includes a first nFET source/drain connected to a second input source/drain of the input pFET to form a main input terminal configured to receive a input voltage signal, a second nFET source/drain connected to a second output source/drain of the output pFET to form a main output terminal that outputs an output voltage, and a nFET gate configured to receive a pass gate nFET select signal.

8. The voltage-protection transmission gate circuit of claim 7, wherein the input pFET further includes an input gate configured to receive a first supply voltage select signal, the first supply voltage select signal having a voltage level less than a high-voltage select signal.

9. The voltage-protection transmission gate circuit of claim 8, wherein the output pFET further includes an output gate configured to receive the first supply voltage select signal.

10. The voltage-protection pass transmission gate circuit of claim 9, further comprising a level shifter including an input terminal configured to receive a high-voltage select signal having a first voltage level and to convert the first voltage level into the pass gate select signal.

11. The voltage-protection transmission gate circuit of claim 10, further comprising a first nFET including a first nFET source/drain connected to the first mid-point node and a second nFET source/drain configured to receive a supply voltage, and a second nFET including a third nFET source/drain connected to the second mid-point node and a fourth source/drain configured to receive a second supply voltage.

12. The voltage-protection transmission gate circuit of claim 11, wherein at least one of the pass gate pFET, the input pFET, and the output pFET includes a gate oxide having a thickness ranging from about 0.8 nanometers (nm) to about 1.0 nm.

13. A method of selectively delivering an input voltage from a main input terminal of a voltage-protecting transmission gate circuit to a main output terminal of the voltage-protecting transmission gate circuit, the method comprising:
applying a pass gate select signal to a first pFET gate terminal of a pass gate pFET that selectively operates the voltage-protecting transmission gate circuit in a voltage blocking mode, a first voltage passing mode, or a second voltage passing mode, the pass gate pFET including a first pFET source/drain connected in series with a first input source/drain of an input pFET to define a first mid-point node, and a second pFET source/drain connected in series with a first output source/drain of an output pFET to define a second mid-point node; and
applying a pass gate nFET select signal to a nFET gate of a pass n-type field effect transistor (nFET) connected in parallel with the pass gate pFET, the input pFET and the output pFET, the pass gate nFET included with the voltage-protecting transmission gate circuit and including a first nFET source/drain connected to a second input source/drain of the input pFET to form the main input terminal, and a second nFET source/drain connected to a second output source/drain of the output pFET to form the main output terminal that outputs an output voltage,
wherein the voltage blocking mode blocks an input voltage applied to the main input terminal from reaching the main output terminal, and wherein the first and second voltage passing modes pass an input voltage from the main input terminal to the main output terminal.

14. The method of claim 13, wherein the voltage-protecting transmission gate circuit operates in the voltage blocking mode when a voltage level of the pass gate select signal is greater than a voltage level of a first supply voltage select signal applied to the input terminal such that a first input voltage applied to the main input terminal is disconnected from the main output terminal.

15. The method of claim 14, wherein, in response to invoking the voltage blocking mode, the first mid-point node has a voltage level approximately equal to the first input voltage.

16. The method of claim 15, wherein, in response to invoking the voltage blocking mode, the second mid-point node has a voltage approximately equal to a second supply voltage.

17. The method of claim 14, wherein the voltage-protecting transmission gate circuit operates in the first voltage passing mode when the voltage level of a high-voltage select signal applied to the input terminal is approximately 0 volts and the input voltage is greater than a voltage level of the pass gate nFET select signal, such that the first input voltage applied to the second input source/drain is delivered to the second output source/drain.

18. The method of claim 17, wherein, in response to invoking the first voltage passing mode, the first and second mid-point nodes have a voltage level approximately equal to the first input voltage.

19. The method of claim 14, wherein the voltage-protecting transmission gate circuit operates in the second voltage passing mode when the voltage level of a high-voltage select signal applied to the input terminal is approximately 0 volts and the input voltage is less than a voltage level of the pass gate nFET select signal, such that a different second input voltage applied to the second input source/drain is delivered to the second output source/drain.

20. The method of claim 19, wherein, in response to invoking the second voltage passing mode, the first and second mid-point nodes have a voltage level approximately equal to the second input voltage.

* * * * *